United States Patent
Behrends et al.

(10) Patent No.: US 7,631,554 B2
(45) Date of Patent: Dec. 15, 2009

(54) TIRE MODULE AND TIRE COMPRISING A MODULE OF THIS TYPE

(75) Inventors: Holger Behrends, Hannover (DE); Thomas Koschnitzki, Hannover (DE); Carsten Reimann, Geimersheim (DE)

(73) Assignee: Continental Tevas AG & Co., Frankfurt (DE)

( * ) Notice: Subject to any disclaimer, the term of this patent is extended or adjusted under 35 U.S.C. 154(b) by 121 days.

(21) Appl. No.: 11/794,601

(22) PCT Filed: Dec. 13, 2005

(86) PCT No.: PCT/EP2005/056756

§ 371 (c)(1),
(2), (4) Date: Feb. 28, 2008

(87) PCT Pub. No.: WO2006/072539

PCT Pub. Date: Jul. 13, 2006

(65) Prior Publication Data

US 2008/0264537 A1    Oct. 30, 2008

(30) Foreign Application Priority Data

Jan. 7, 2005    (DE)    .................. 10 2005 000 996

(51) Int. Cl.
*B60C 23/02* (2006.01)
(52) U.S. Cl. ...................................... 73/146.5
(58) Field of Classification Search ........ 73/146–146.8; 340/445, 447
See application file for complete search history.

(56) References Cited

U.S. PATENT DOCUMENTS

| | | | |
|---|---|---|---|
| 4,237,728 A | 12/1980 | Betts et al. | |
| 4,384,482 A | 5/1983 | Snyder | |
| 4,510,484 A | 4/1985 | Snyder | |
| 6,252,336 B1 | 6/2001 | Hall | |
| 6,998,975 B2 * | 2/2006 | Buck et al. | 340/447 |
| 7,005,778 B2 | 2/2006 | Pistor | |
| 7,489,045 B1 * | 2/2009 | Bradford et al. | 290/1 R |

FOREIGN PATENT DOCUMENTS

DE    4402136    7/1995

* cited by examiner

*Primary Examiner*—Andre J Allen

(57) ABSTRACT

Disclosed is a tire module for sensing tire condition variables with a spring element (2) clamped on one end and a converting unit (2, 3, 4, 6, 7), in which kinetic energy is converted into electric energy. The spring element (2) is a bar spring, torsion spring, or leaf spring, with a seismic mass (3) being arranged at the end of the spring element that is not clamped, and the spring element transmits acceleration jumps of the seismic mass (3) to the converting unit (2, 3, 4, 6, 7).

21 Claims, 2 Drawing Sheets

TIRE MODULE AND TIRE COMPRISING A MODULE OF THIS TYPE

BACKGROUND OF THE INVENTION

The present invention relates to a tire module for sensing tire condition variables with a spring element clamped on one end and a converting unit, in which kinetic energy is converted into electric energy, and a pneumatic tire equipped with such a tire module.

The invention is particularly well suited to determine tire condition variables and road pavement characteristics with an energy-self-supporting system.

DE 44 02 136 A1 discloses a system for determining the operating parameters of vehicle tires, in which a support member accommodates a sensor unit, an evaluating electronic unit, and a piezoelectric element supplying the other system components with energy. The piezoelectric element has a multi-layer design.

Further, DE 101 03 952 discloses a device for the energy supply to a sensor, which includes a passive piezoelectric transducer, which is deformable by a mechanic energy accumulator and supplies a corresponding voltage for operation of the sensor. The piezoelectric transducer is bendable due to the deformation work provided by the energy accumulator. The structure including a bar spring and a compression spring arranged at the free end of the bar spring is sophisticated.

Based on the above state of the art, an object of the invention is to provide an improved tire module rendering energy supply possible in a simple and reliable fashion, even at low rotational speeds of the tire.

SUMMARY OF THE INVENTION

According to the invention, this object is achieved in that the spring element is a bar spring, torsion spring or leaf spring, and a seismic mass is arranged at the end of the spring element that is not clamped, to which mass a pulse is applied due to the rolling of the tire. The mounting support of the seismic mass at the spring element develops a spring-mass oscillator, which has an increased efficiency as compared to conventional piezoelectric energy transducers. The oscillation is produced because the tire module is moving on a straight path when rolling during each tire tread passage, while it is moving on a circular path after leaving the tire contact area. During the circular path, the centrifugal force acts on the seismic mass, during passage of the tire contact area it is ideally without force. The spring-mass oscillator displaces due to the centrifugal force and aims at returning to its rest position during passage through the tire contact area. Overswing movements and post-pulse oscillations occur, whereby the seismic mass is in motion also during the phases of constant force, that means between the transitions. This is particularly favorable for the electric energy conversion.

An improvement of the invention provides that the spring element is clamped in a housing, and at least one piezoelectric element is coupled to the spring element in the moving direction. The piezoelectric element converts the kinetic energy of the spring-mass oscillator into electric energy, which in turn can be relayed to consumers. Favorably, piezoelectric elements are coupled to the spring element in each moving direction of it so that electric energy can be obtained from both piezoelectric elements upon an oscillation in the respective planes in both directions of displacement.

To achieve a compact construction, the piezoelectric element or the piezoelectric elements is/are attached directly to the spring elements so that an deflection of the spring element causes expansion or upsetting deformation of the piezoelectric layer, with the result that electric voltage can be tapped from the corresponding contact surfaces.

Alternatively, it is provided that the converting unit operates inductively. As this occurs, the flux of a magnetic circuit is modulated by the movement of the spring element or the seismic mass, respectively. One embodiment of the inductive converting unit arranges for the spring element to have a leaf-type design, preferably a concentric or circular design. The seismic mass is arranged in the center of the leaf-type spring element, preferably in the point of gravity, and depressions, preferably concentric depressions, are provided to render the leaf-type spring swingable. When passing through the tire contact area, the air slot between magnet and seismic mass changes, with the result of the magnetic flux in the ferromagnetic circuit changing. The change of flux can be converted into an electric voltage using a coil that is arranged appropriately.

To procure the direct current that is required for operation of electric and electronic elements, it is arranged in an improvement of the invention that the tire module is equipped with a rectifier connected to the converting unit. The rectifier is preferably configured as a bridge rectifier.

In order to allow evaluation of tire condition variables or any other function of the tire module likewise during standstill of the tires, it is provided that an electric energy accumulator, in particular a capacitor, is assigned to the rectifier. It is thus possible to store the surplus of produced energy, which was not required during operation of the tire, and to make use of it at a suitable time.

To achieve a complete module unit for sensing tire condition variables, an evaluating unit is also connected to the converting unit in order to evaluate the electric output signal of the converting unit or other sensor data. It is thus possible to determine the tire contact length, i.e. the size of the contact area of the tire, e.g. on the basis of the interval between two acceleration pulses. It is likewise possible to determine the wheel rotational speed or the wheel load. Other sensors, such as sensors to sense the air pressure or the tire temperature, can also be connected to the evaluating unit.

In order to make the data sensed or calculated in the evaluating unit available to other systems in the vehicle, a transmitter is favorably allocated to the tire module and allows transmitting the tire condition data to control systems or for the output to a display device. A tire module of this type permits determining the tire contact length by means of the shorter distance between two pulses of the converting unit. The time variation and the amplitude of the output signal of the converting unit can be used directly to determine tire condition variables.

As very high acceleration forces are encountered at very high speeds, there is the danger of the spring breaking as it is freely compressed. Therefore, arrangements have been made to fit stops in the housing in the moving direction of the spring element, the stops limiting movement of the spring. Favorably, the springs are designed in such a way that they correspond to the elastic line of the spring element or have a curvature less than the elastic line of the spring element.

This renders it possible that the spring element rolls on the stops so that the mechanical stress of the spring element is reduced.

In an improvement, elastically designed stop surfaces are arranged on the stops so that smooth rolling on the stop surfaces is possible. The stop surfaces have a rubber-elastic or springy design, and the deformation energy is converted into heat during rolling in a rubber-elastic design, while in a springy design of the stop surfaces the kinetic energy remains in the system and can be converted into electric energy in the post-pulse oscillation. When the springy stop surfaces are configured as stop springs, they favorably exhibit a higher spring constant than the spring element with the seismic mass, thus safeguarding a resilient effect even at high speeds. Likewise the stop surfaces should have a curvature less than the elastic line of the spring element. The stop surfaces can have an integral design, or they can be composed of several segments or layers, with a segment-wise design having the advantage of tuning the spring rates with respect to the deflection of the spring element.

It is provided additionally or alternatively that an amplitude limiter is associated with the seismic mass in order to avoid destruction at very high speeds.

A pneumatic tire of the invention provides that the tire module described hereinabove is arranged on the tire inside surface, especially is vulcanized thereinto. The extension of the tire module in a circumferential direction can be minimized by arranging the spring element in its axial extension in parallel to the axis of rotation of the pneumatic tire. As a result, the friction between the tire module and the inside surface of the tire, the so-called 'inner liner', is minimal, what improves the service life of the tire module or the system composed of tire module and pneumatic tire, respectively.

Preferably, the length of the spring element ranges from 8 mm to 40 mm, the seismic mass weighs between 0.5 g and 5 g, and the deflection of the seismic mass ranges between 1 mm and 15 mm.

In addition to piezoelectric or inductive energy conversion, capacitive energy conversion can take place as well, when the spring element is electrically charged in relation to the fixed stops. In a movement, which is induced by the acceleration jumps when entering the tire contact area and exiting therefrom, the electric voltage of the spring element vis-á-vis the stops will change, if the charge on the spring element is constant. This embodiment is favorable when the converting unit has a micromechanical design.

In the following, embodiments of the invention will be explained in detail by way of the attached Figures.

BRIEF DESCRIPTION OF THE DRAWINGS

In the accompanying drawings.

DETAILED DESCRIPTION OF THE DRAWINGS

Figure 1:
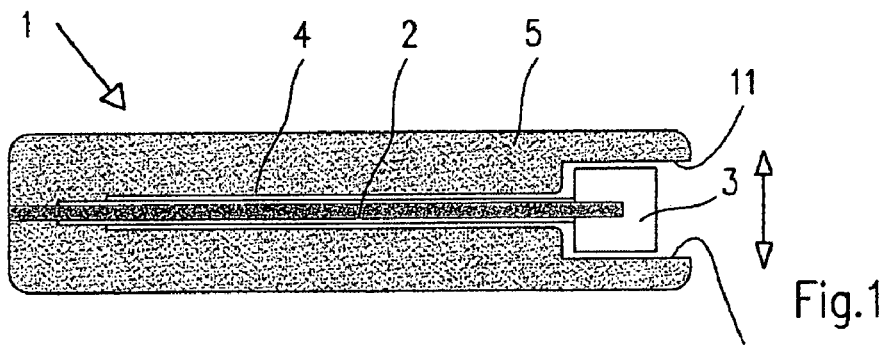
FIG. 1 is a schematic cross-sectional view of a tire module with a converting unit.

FIG. 1 shows a cross-sectional view of a tire module 1, which is preferably arranged on the inside surface of a pneumatic tire, opposite to the tread area. The housing 5 includes a slot in which a spring element 2, mainly designed as a leaf spring, is clamped at one end. At the end of the spring element 2 that is opposite to the clamped end, a seismic mass 3 is arranged which is set to oscillate due to a mechanical pulse. Together with the seismic mass 3, the spring element 2 forms a spring-mass oscillator performing an oscillating movement within the housing 5. A piezoelectric layer 4 is applied in each case to the top side and the bottom side of the spring element 2, the layer being appropriately polarized and furnished with contact surfaces. The application is such that an deflection of the spring element 2 causes an expansion or upsetting deformation of the piezoelectric layers 4. Electric voltage can be tapped at contact surfaces (not shown) so that the kinetic energy, due to the oscillating seismic mass 3, can be converted into electric energy through the piezoelectric layers 4. The spring element 2 or the leaf spring then acts as a travel converting means, in which an deflection of the seismic mass 3 by a few millimeters causes a variation of length of the piezoelectric material 4, what produces electric energy by utilizing the piezoelectric effect.

The tire module 1 makes use of the acceleration jumps that occur between a circular path and the passage of the tire through the tire surface area for the production of energy by setting the seismic mass 3 to oscillate on account of the acceleration jumps upon entry into the tire contact area and exit from the tire contact area. The tire module 1 of the invention is advantageous in that the conversion of energy takes place not only during the acceleration jumps during entry into the tire contact area and exit from the tire contact area but also during the post-pulse oscillation of the oscillatory spring-mass oscillator after its excitation. The post-pulse oscillation permits converting kinetic energy into electric energy for a long time. The distribution of the energy output over a long time achieves a higher efficiency than in conventional piezoelectric energy generators.

Another advantage of the tire module of the invention can be seen in its simple and robust construction permitting low-cost manufacture. In the embodiment shown, the spring element 2 is configured as a steel leaf spring, however, it is also feasible to use other materials. In the embodiment according to FIG. 1, the piezoelectric layer 4, in conjunction with the upsetting deformation or expansion due to the oscillation, represents the converting unit, in which kinetic energy is converted into electric energy pulses.

Alternatively, the arrangement of the piezoelectric layer or piezoelectric elements 4, respectively, can be such that an upsetting deformation in the moving direction at the housing 5 brings about the piezoelectric effect, that means when the piezoelectric layer 4 abuts on the housing inside wall 5.

Figure 2:
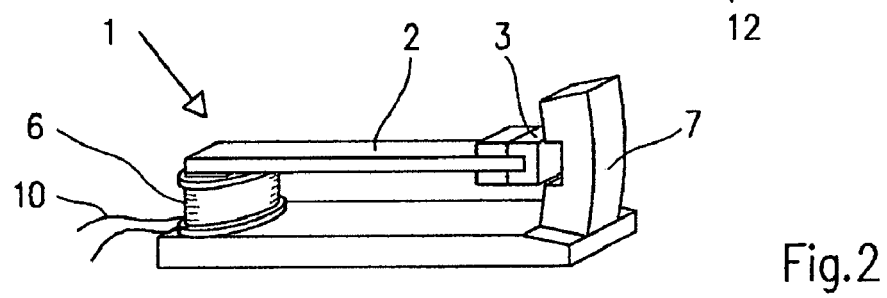
FIG. 2 is an inductive design of a converting unit.

Instead of using a converting unit that is based on piezoelectric effects, energy can be converted by means of induction. One possible embodiment is shown in FIG. 2, in which the spring element 2 is designed as a leaf spring, at the free end of which a permanent magnet 3 is attached as seismic mass. The clamped end of the leaf spring 2 is mounted on a coil 6, and the electric pulses are e.g. led to a rectifier through lines 10. In the tire module 1 according to FIG. 2, the movement of the leaf spring 2 modulates the flux of a magnetic circuit. The magnetic circuit is preferably designed in such a manner that the spring steel of the leaf spring 2 is part of the magnetic circuit, i.e. the flux is conducted by the leaf spring 2. The seismic mass 3 designed as a permanent magnet feeds the magnetic circuit. The coil 6 can be shifted or wound around the ferromagnetic circuit at any desired location, but it should comprise the total flux, if possible. Alternatively, rotationally symmetric designs of the generator are feasible, and the yoke 7 with pole shoes is arranged opposite to the seismic element 3. Yoke 7 comprises all unmoved, flux-conducting parts of the magnetic circuit without the exciting magnet itself.

Figure 3:
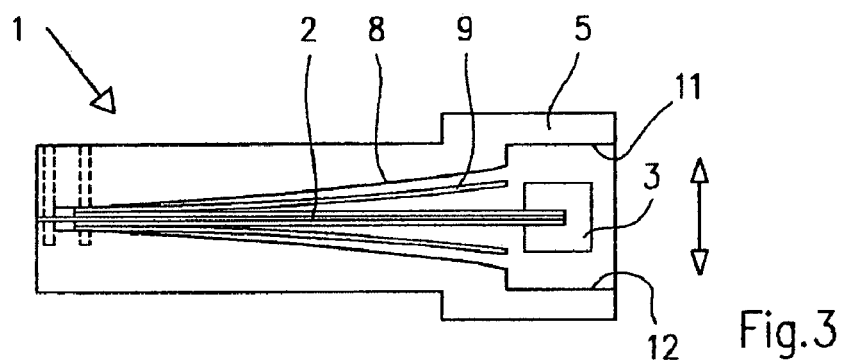
FIG. 3 is a variation of FIG. 1.

FIG. 3 depicts a variation of the tire module according to FIG. 1, wherein stops 8 are provided in the housing 5 in the moving direction of the seismic mass 3, the contour of the stops corresponding to the elastic line of the spring element 2. In a relatively soft layout of the spring element 2, already insignificant acceleration jumps upon entry into the tire contact area and exit from the tire contact area, resulting from low vehicle speeds, cause a great deflection of the seismic mass 3.

A yielding layout of the spring element 3 is desired in order to obtain electric voltage that can be utilized even at low vehicle speeds. At higher speeds with correspondingly great acceleration jumps, the deflections of the seismic mass 3 become very large so that the spring element 3 can break. Stops 8 as well as amplitude limiters 11, 12 for the seismic mass 3 are provided for this purpose. Both the stops 8 and the amplitude limiters 11, 12 can have a hard, rubber-elastic or springy design. A hard design is most favorable in terms of costs, it involves, however, the shortcoming of a great mechanical load on the spring element 2 and the seismic mass 3. With rubber-elastic stops 8 or amplitude limiters 11, 12, the excessive energy is converted into heat, while with spring stops 8 or amplitude limiters 11, 12 the excited energy stays in the system as kinetic energy and can be converted into electric energy in post-pulse oscillations. It is arranged for in a springy design that stop surfaces or stop springs 9 are provided on or in front of the stops 8, which have a higher spring constant than the spring element 2, so that the stop springs 9 will not assume their coil bound length, not even at high speeds and correspondingly high rates of energy.

If fixed stops 8 are provided, the contour is favorable when in the shape of an elastic line of the spring element 2 so that the spring element 2 moves into abutment on the stop 8. In case the curvature is less than that one of the elastic line of the spring element 2, the spring element 2 rolls in the corresponding deflection on the stop 8.

It can be seen in FIG. 3 that the elastic stop springs 9 also have the shape of an elastic line, optionally, with a curvature less than that of the elastic line of the spring element 2, with the stop springs 9 together with the spring element 2 being fixedly clamped in the housing. With a sufficient rate of deflections of the seismic mass 3 and, thus, curvature of the spring element 2, the spring element 2 will initially move to bear against the stop springs 9, whereby the spring constant of the overall assembly is increased.

In this embodiment, the tire module 1 is able to supply energy both at low vehicle speeds and at high speeds. Without the provision of stop springs 9, the time in the tire tread passage at high speeds will not be sufficient for the spring element 2 to lift the seismic mass 3 from its abutment to a noticeable extent. Very small motion amplitudes would result therefrom, with the result of a correspondingly low energy output. In order to lose little energy due to friction processes, it is arranged to preferably design the surfaces of the spring element 2 and the elastic stop surfaces 9 in such a way that they are prevented from sliding on each other during abutment and deflection.

It is advantageous in the embodiment of FIG. 3 that the contour of the stop 8 has a more pronounced curvature compared to that of the elastic stop surfaces 9 so that, with rising vehicle speed, the spring element will first move into abutment on the elastic stop surface 9 and, with further increase in speed, the spring element 2 along with the elastic stop surface 9 will abut on the fixed stop 8. The result will be that destruction of the spring element is prevented even at highest speeds.

As an alternative of an integral design, several stop surfaces 9 can be arranged one behind the other in the moving direction of the seismic mass 3 so that a spring constant is realized that is stepped linearly several times.

Progressive spring characteristic curves can also be achieved in that the elastic stop surfaces 9 are designed using leaf springs, which are stepped several times and have different lengths. The later the respective leaf spring moves into abutment, the shorter and stiffer it is, whereby progressive spring characteristic curves are achieved.

In lieu of fixed stops 8 or amplitude limiters 11, 12, it is also possible to protect the tire module 1 from being destroyed at high speeds by filling it with an appropriate fluid, excess energy is converted into heat and is lost for the electric energy recuperation.

In a favorable embodiment and arrangement, the tire module 1 is mounted in parallel to the axis of rotation of the tire with respect to its longitudinal extension, i.e. in such a manner that the spring element 2 is aligned in parallel to the wheel axis. The extension of the tire module 1 in a circumferential direction of a tire is thereby minimized, what minimizes in turn the friction between the tire module 1 and the abutment on an inner liner of a pneumatic tire, with the result of improving the service life of the arrangement.

As an alternative of the described embodiments with a leaf spring 2 as spring element, the tire module can also have a cylindrically symmetric design. In the case of electrodynamic energy conversion, the ferromagnetic circuit closes by way of the cylinder walls, while the permanent magnet lies in the cylinder axis. The spring-mass oscillator is then formed with a seismic mass, which is also arranged on the cylinder axis and is attached to the cylinder cover. To enable the cover to assume the function of the spring, it is furnished with concentric depressions and is made of spring steel. The air slot between magnet and seismic mass is changed due to the acceleration jumps during passage over the tire contact area, whereby the magnetic flux in the ferromagnetic circuit changes. The change in flux can be converted into an electric voltage by way of a suitably arranged coil.

Figure 4:
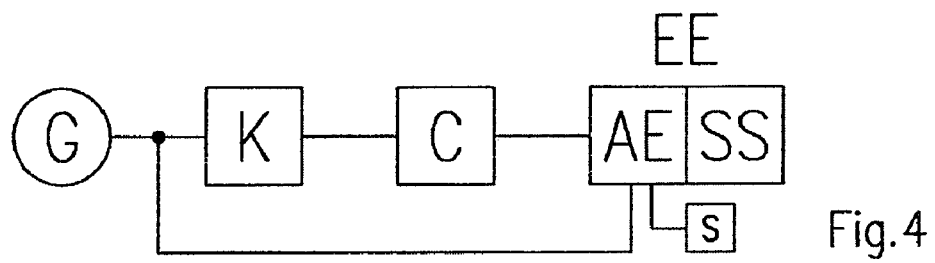
FIG. 4 is a wiring diagram of a tire module.

In order to be able to utilize the energy procured by the converting unit or the energy generator in a suitable fashion, it is necessary to rectify the voltage, which usually prevails as an alternating voltage. FIG. 4 shows a circuit arrangement with a generator G, which corresponds to the converting unit of FIG. 1. The latter is connected to a converter K converting the alternating voltage into d.c. voltage. A reservoir capacitor C connects to the converter K to allow energy storage. An electronic unit EE, comprising an evaluating unit AE and a transmitter stage SS, is connected downstream of the capacitor. Likewise the generator signals are sent directly to the evaluating unit AE so that electric signals are transmitted to the evaluating unit AE due to the generator output variables such as voltage, current, frequency and output. These electric signals of the generator G thus represent a standard of the mechanical excitations developing in the tire. However, as the mechanical excitations depend on the special conditions in the respective tire, such as dimension, depth of profile or deformation, it is possible to produce tire condition variables from the electric signals of the generator G. The detection of the tire contact length is illustrated as an example. Due to the acceleration jumps upon entry into the tire contact area and exit from the tire contact area, excitation is imparted to the generator, which is pictured as a pulse in the electric signal. The pulses are sensed in the evaluating unit AE for e.g. a tire revolution and a calculation of the tire contact length based on the period during the pulses. The calculation can also be carried out in a sensing device on the vehicle. In this case, only the pulses from the tire module are transmitted, and the temporal distance between the pulses is evaluated in the sensing device. Thus, there is no need to fit an additional sensor. The tire contact length and the number of rolling actions are important input variables for a wear model to determine the remaining distance of run flat tires. However, another sensor S can be provided alternatively or in addition, which is likewise furnished with energy by way of the capacitor C and senses the temperature, for example. The evaluated data is output through the transmitting stage SS to the engine control or chassis control or to the operator.

As the generator G is loaded due to the impedance of the capacitor C during the charging process of the capacitor C, changing the output voltage of the generator G compared to idle running, this change can prevent or in admissibly impair a detection of the tire condition variables. It is therefore provided according to FIG. 5 that the rectifier or converter K is controlled by the electronic unit EE in such a manner that the capacitor C is charged one time through the converter, while the generator G is loaded with the capacitor impedance during these periods of time. In the alternative state, the rectifier K is shut off, consequently, the capacitor C cannot be charged. Accordingly, the generator G is not loaded with the capacitor impedance so that the tire condition variables can be sensed in the load-free case. The electronic unit EE controls the change-over between these two states in such a way that sufficient energy is always available to supply the overall system or tire module, on the one hand, and sensing of the tire condition variables is optimal, on the other hand.

Figure 5:
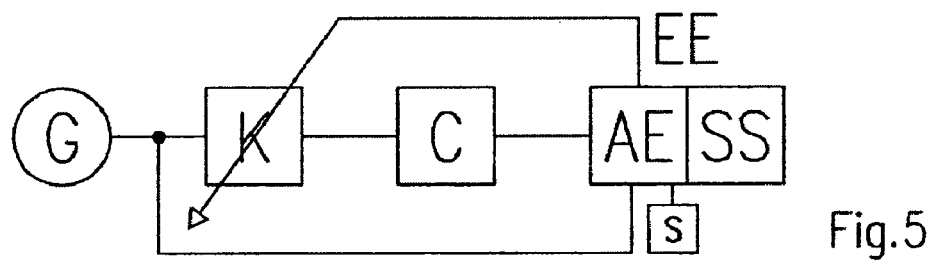
FIG. 5 is an improvement of the arrangement of FIG. 4.

The arrangements of FIGS. 4 and 5, in which a tire module according to FIGS. 1 to 3 can be employed, can be used e.g. to determine the wheel load or to detect the depth of the tire profile. It is likewise possible that an energy management system is stored in the electronic unit EE, which renders it possible to sense measured variables also during standstill of the tires and to transmit data to a receiving control device. To this end, e.g. an additional capacitor C can be charged, which is used exclusively for the energy supply of the system during vehicle standstill. The charging and discharging processes of this capacitor are controlled by the electronic unit EE so that it is possible to detect stealthy pressure loss even during vehicle standstill. Tire-related data can also be saved in the electronic unit and transmitted to a central control device, what allows the optimal adjustment of driving dynamics controllers to the respective type of tire. A change from winter tires to summer tires is automatically recorded, for example. The system according to FIGS. 4 and 5 can also be used to protocol the tire conditions because it senses quantities such as the tire pressure, the distance covered, forces in the tire, acceleration jumps, and like quantities, saving them, if necessary. Thus, it is e.g. possible to find out whether the tire has been operated with inadmissible pressures and which distance has been covered in this state. In addition, driving over large obstacles such as curbstones can be detected, and this information can be used to calculate the remaining useful life of the respective tire.

Figure 6A:
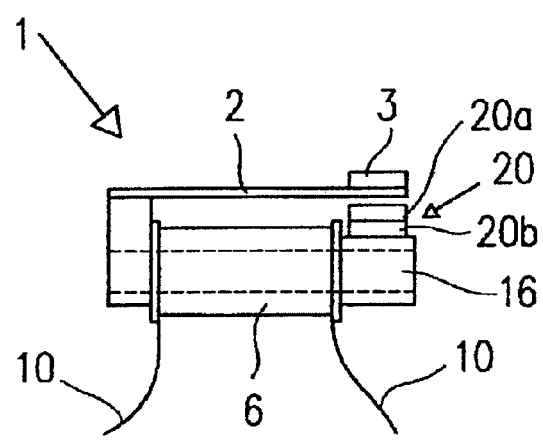
FIG. 6 is an illustration of a tire module with magnetic short-circuit.
Figure 6B:
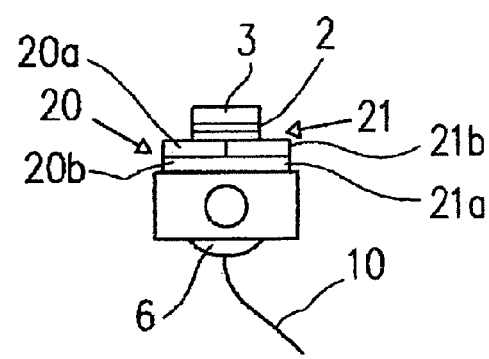

FIG. 6 shows a tire module 1 with an energy-converting unit based on the principle of induction. Arranged on top of an iron core 16 is a coil 6, which is connected through cable 10 to an evaluating unit (not shown). Exciting magnets 20, 11 are arranged in opposing direction at one end of the iron core 16. At the opposite end, a spring element in the shape of a leaf spring 2 is attached in a way swinging on one side. An air slot is provided between the exciting magnets 20, 21, and a seismic mass 3 is arranged above the air slot and above the exciting magnets 20, 21. As can be seen in the right-hand illustration of FIG. 6, the exciting magnets 20, 21 are arranged in opposing direction, meaning that the north pole 20a and the south pole 21b of the exciting magnets 20, 21 are opposed to one another, while south pole 20b and north pole 21a of the exciting magnets 20, 21 are opposed to one another. A temporally variable flux in the magnetic circuit is required for voltage induction. The change in flux is produced according to FIG. 6 in that the size of the air slot is modified or a magnetic short-circuit is provoked by the movement of the seismic mass 3. The induction is produced by the modulation of the stray flux of the magnets 20, 21. There is little stray flux in a short circuit, while there is much stray flux in an operation with an air slot so that an increased voltage induction occurs in an operation with an air slot.

In an arrangement according to FIG. 2, the time variation of the magnetic flux is achieved by changing the air slot length in an deflection of the spring element 2. A greater change in flux can be expected with magnetization of the pole shoes, and the pole shoes can be magnetized in an alternating north-south-north-south fashion, if necessary.

The tire module of the invention and the system fitted in the tire module, respectively, renders it possible to realize at very low costs an energy-self-supporting system with a useful life that is independent of a battery for the purpose of sensing, saving and further processing tire condition variables as well as variables related to driving dynamics. Advantageously, the tire module is attached on the inside surface of the tire. Allocated to the tire module is a memory device in which data about the tire pressure and the duration of the operation of the tire with a corresponding tire pressure is saved. When a tire is operated with insufficient tire pressure for a long time, this fact can cause increased wear. When the tire fails and an accident happens, this data can be polled in order to prove that the tire has been treated improperly and that such treatment of the tire caused premature failure.

Favorably, the tire module is initialized when testing the brakes in the manufacture of the vehicle and is optionally furnished with an identification number, which is saved in a memory.

The tire module can also measure tire vibrations, for example in the range of 100 hertz, in order to infer occurring irregularities from tire damages.

The invention claimed is:

1. A tire module for sensing tire condition variables with a spring element with two ends, one of the ends being clamped in and the other end being movable in at least one moving direction, and with a converting unit, in which kinetic energy is converted into electric energy, wherein the spring element (2) is a bar spring, torsion spring or leaf spring, with a seismic mass (3) being arranged at the other end of the spring element, which has at least one direction of movement, and the spring element transmits acceleration jumps of the seismic mass (3) to the converting unit (2, 3, 4, 6, 7).

2. The tire module as claimed in claim 1,
   wherein the spring element (2) is clamped in a housing (5) and is coupled to at least one piezoelectric element (4) converting kinetic energy into electric energy.

3. The tire module as claimed in claim 2,
   wherein at least one of the piezoelectric elements (4) is mechanically coupled to the spring element (2) in each moving direction.

4. The tire module as claimed in claim 2,
   wherein the at least one piezoelectric element (4) is attached to the spring element (2).

5. The tire module as claimed in claim 1,
   wherein the converting unit (2, 3, 6, 7) operates inductively or capacitively.

6. The tire module as claimed in claim 5,
   wherein the spring element (2) is a leaf spring and the seismic mass (3) is arranged in the center of gravity of the leaf spring.

7. The tire module as claimed in claim 5,
wherein the seismic mass (3) is configured as a permanent magnet or a charge carrier.

8. The tire module as claimed in claim 1,
wherein a rectifier (K) is connected to the converting unit (4; 2, 3, 6, 7; G).

9. The tire module as claimed in claim 8,
wherein an electric energy accumulator (C) is connected to the rectifier (K).

10. The tire module as claimed in claim 1,
wherein an evaluating unit (AE) for evaluating electric pulses is connected to the converting unit (4; 2, 3, 6, 7; G).

11. The tire module as claimed in claim 10,
wherein a control unit (EE) is associated with the rectifier (K) and selectively relays the pulses of the converting unit (4; 2, 3, 6, 7; G) to the rectifier (K) or the evaluating unit (AE).

12. The tire module as claimed in claim 10,
wherein a sensor (S) and/or a transmitter (SS) is connected to the evaluating unit (AE).

13. The tire module as claimed in claim 1,
wherein stops (8) are provided in each moving direction of the spring element (2).

14. The tire module as claimed in claim 13,
wherein the stops (8) correspond to the shape of the spring element (2) when it is bent or have a curvature less than that of the bent spring element (2).

15. The tire module as claimed in claim 13,
wherein elastically designed stop surfaces (9), are arranged on the stops (8).

16. The tire module as claimed in claim 15,
wherein the curvature of the stop surfaces (9) is less than that of the stops (8).

17. The tire module as claimed in claim 15,
wherein the stop surfaces (9) are composed of several segments or layers.

18. The tire module as claimed in claim 1,
wherein amplitude limiters (11, 12) are associated with the seismic mass (3).

19. The tire module as claimed in claim 1,
wherein the length of the spring element (2) ranges from 8 mm to 40 mm, the seismic mass (3) weighs between 0.5 g and 5 g, and the deflection of the seismic mass (3) ranges between 1 mm and 15 mm.

20. A pneumatic tire comprising a tire module with a spring element with two ends, one of the ends being clamped in and the other end being movable in at least one moving direction, and with a converting unit, in which kinetic energy is converted into electric energy,
wherein the spring element (2) is a bar spring, torsion spring or leaf spring, with a seismic mass (3) being arranged at the other end of the spring element, which has at least one direction of movement, and the spring element transmits acceleration jumps of the seismic mass (3) to the converting unit (2, 3, 4, 6, 7), wherein the tire module (1) is arranged on the inside surface of the tire.

21. The pneumatic tire as claimed in claim 20,
wherein the spring element (2) extends axially in parallel to the axis of rotation of the pneumatic tire.

* * * * *